United States Patent
Uesugi et al.

(10) Patent No.: US 9,215,822 B2
(45) Date of Patent: Dec. 15, 2015

(54) BASE STATION

(71) Applicant: FUJITSU LIMITED, Kawasaki-shi, Kanagawa (JP)

(72) Inventors: Kenichi Uesugi, Yokohama (JP); Yoshihisa Nakagawa, Yokohama (JP); Hideki Sonobe, Yokosuka (JP); Toshimitsu Kobayashi, Otawara (JP); Atsushi Kaneko, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 356 days.

(21) Appl. No.: 13/852,593

(22) Filed: Mar. 28, 2013

(65) Prior Publication Data
US 2013/0321989 A1 Dec. 5, 2013

(30) Foreign Application Priority Data
May 29, 2012 (JP) .................. 2012-122382

(51) Int. Cl.
*H05K 5/02* (2006.01)
*H05K 5/06* (2006.01)
*H05K 7/20* (2006.01)

(52) U.S. Cl.
CPC .............. *H05K 5/068* (2013.01); *H05K 5/0213* (2013.01); *H05K 7/209* (2013.01)

(58) Field of Classification Search
CPC ............................ H05K 5/068; H05K 5/0213
See application file for complete search history.

(56) References Cited

U.S. PATENT DOCUMENTS

| | | | | |
|---|---|---|---|---|
| 3,255,311 A | * | 6/1966 | Hofmeister et al. | 348/838 |
| 5,995,851 A | * | 11/1999 | Lim | 455/561 |
| 6,904,933 B2 | * | 6/2005 | Oyamada | 137/541 |
| 2002/0090506 A1 | * | 7/2002 | Protzner et al. | 428/334 |
| 2011/0030388 A1 | * | 2/2011 | Johansson et al. | 62/3.4 |

FOREIGN PATENT DOCUMENTS

| | | |
|---|---|---|
| CN | 201197184 Y * | 2/2009 |
| JP | 2-41451 U | 3/1990 |
| JP | 2003-188569 A | 7/2003 |
| JP | 2007-115965 A | 5/2007 |

\* cited by examiner

*Primary Examiner* — Ramon Barrera
(74) *Attorney, Agent, or Firm* — Arent Fox LLP

(57) ABSTRACT

A base station, includes: an electronic unit; a housing, including a resin, configured to accommodate the electronic unit; a valve, provided in the housing and including a communication channel communicating an inside of the housing with an outside, configured to open the communication channel if an internal pressure of the housing exceeds a value.

20 Claims, 14 Drawing Sheets

BASE STATION

CROSS-REFERENCE TO RELATED APPLICATION(S)

This application is based upon and claims the benefit of priority of the prior Japanese Patent Application No. 2012-122382, filed on May 29, 2012, the entire contents of which are incorporated herein by reference.

FIELD

The embodiments discussed herein are related to a base station.

BACKGROUND

A base station includes an electronic unit and a housing that is made of metal and accommodates the electronic unit.

Related techniques are disclosed in Japanese Laid-open Patent Publication No. 2007-115965, Japanese Unexamined Utility Model Registration Application Publication No. 2-41451, and Japanese Laid-open Patent Publication No. 2003-188569.

SUMMARY

According to one aspect of the embodiments, an base station, includes: an electronic unit; a housing, including a resin, configured to accommodate the electronic unit; a valve, provided in the housing and including a communication channel communicating an inside of the housing with an outside, configured to open the communication channel if an internal pressure of the housing exceeds a value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Due to wind and rain outdoors, a base station may include an electronic unit that has high protection performance and is accommodated inside a housing.

Figure 1:
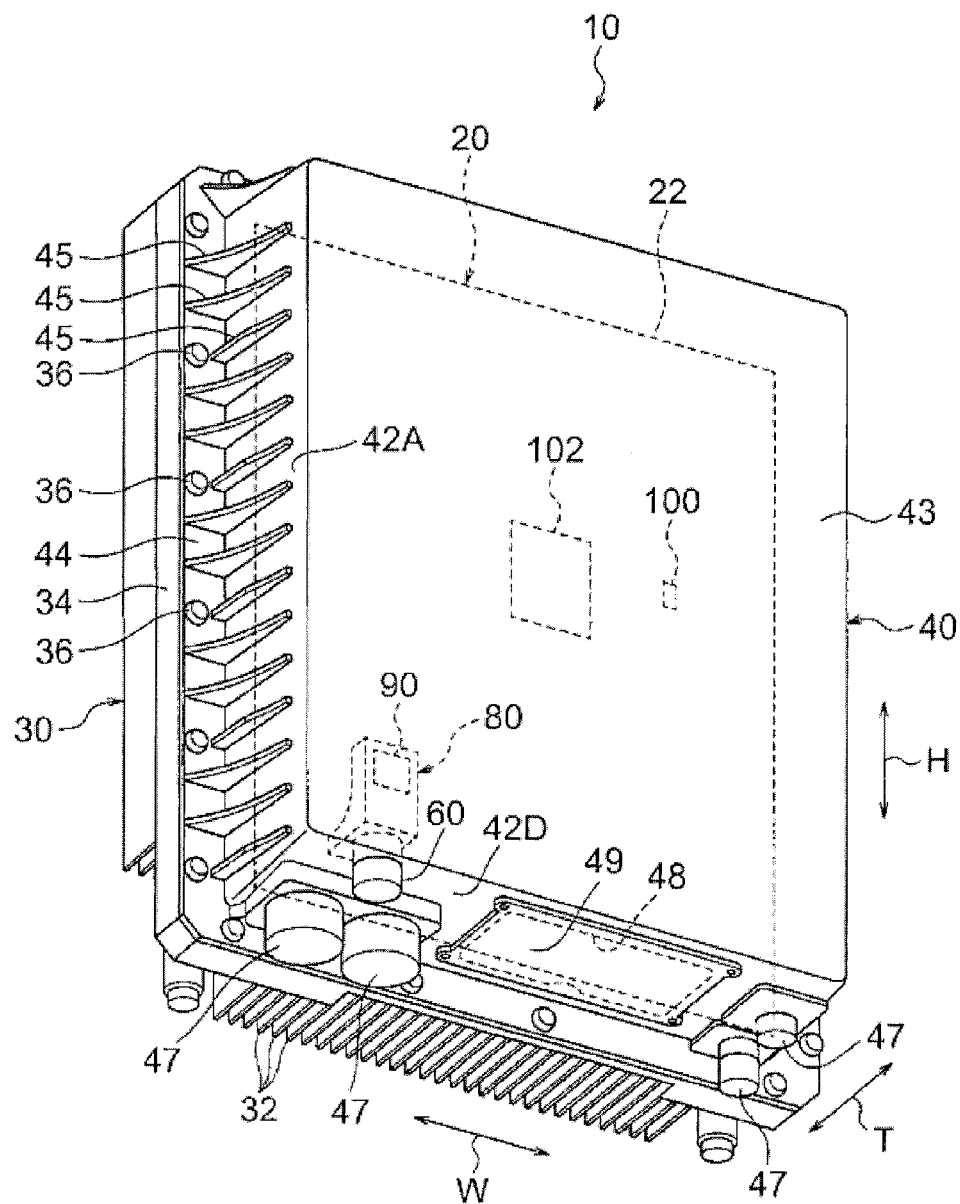
FIG. 1 illustrates an exemplary base station.

FIG. 1 illustrates an exemplary base station device. An base station 10 (hereinafter, abbreviated as a base station 10) includes an electronic unit 20, a heat sink 30, a housing 40, a valve 60, a guide member 80, a Peltier element 90, and a temperature humidity sensor 100.

The electronic unit 20 may include a circuit board 22 that has a plurality of implementation components (not illustrated), such as electronics, implemented therein, and is accommodated in the housing 40. The heat sink 30 includes a plurality of fins 32 and is coupled to a heat generating component among the implementation components implemented in the circuit board 22. The heat sink 30 may have an outer shape substantially identical to an outer shape of the housing 40. A peripheral portion 34 of the heat sink 30 is joined to a flange 44 by a plurality of fastening members 36 in a state of being superimposed on the flange 44 that is formed in a peripheral portion of the housing 40.

FIGS. 2A through 2F illustrate an exemplary housing. In FIGS. 2A through 2F, six orthogonal views of the housing 40 are illustrated. For example, the housing 40 may include a resin, such as polycarbonate, and may have a box shape having an opening portion (refer to FIGS. 2A through 2F). An opening portion 41 of the housing 40 is covered with the heat sink 30. The housing 40 is provided with a plurality of, for example four, side wall portions 42A through 42D and a bottom wall portion 43 that is surrounded by the side wall portions 42A through 42D.

Figure 2A:
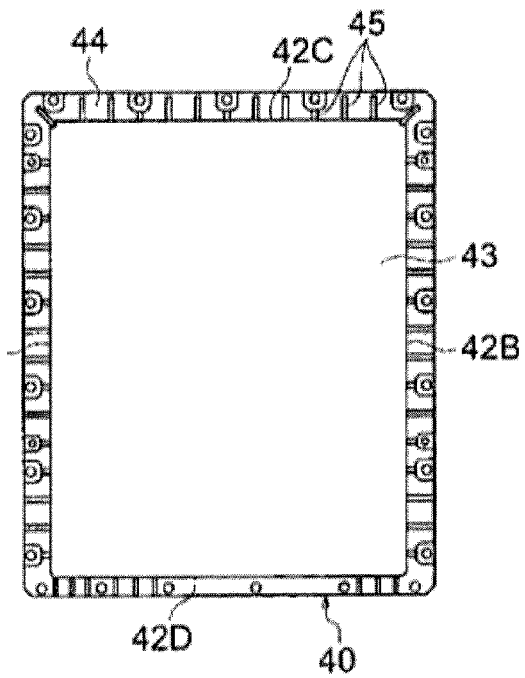
FIGS. 2A through 2F illustrate an exemplary housing.
Figure 2B:
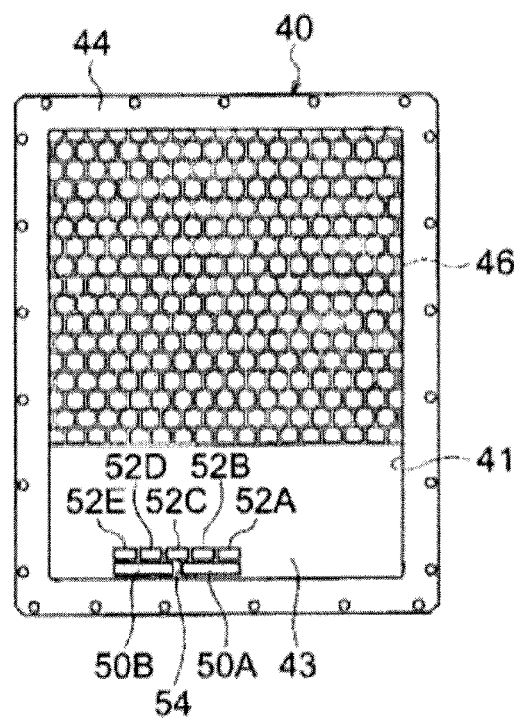
Figure 2C:
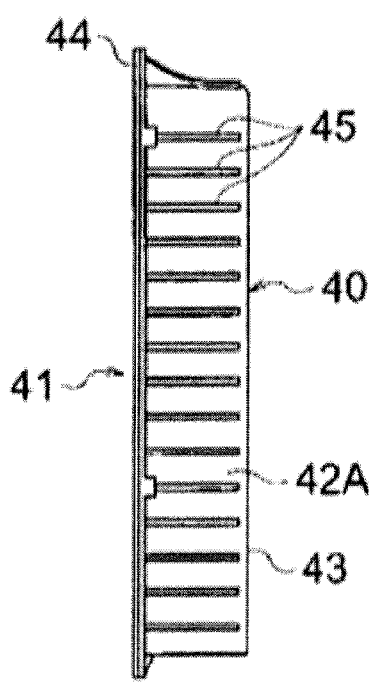
Figure 2D:
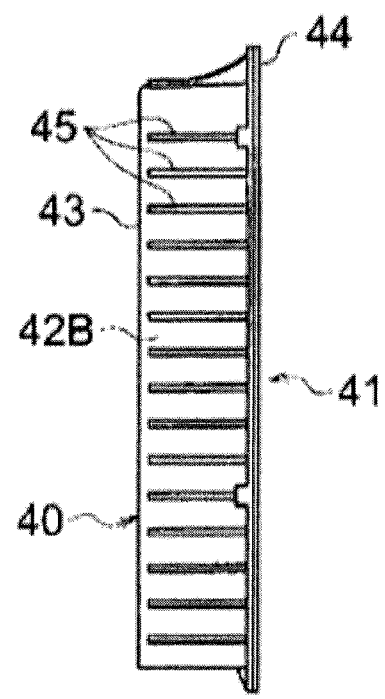
Figure 2E:
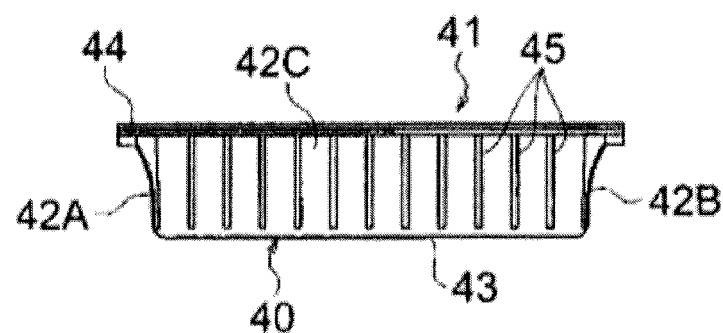
Figure 2F:
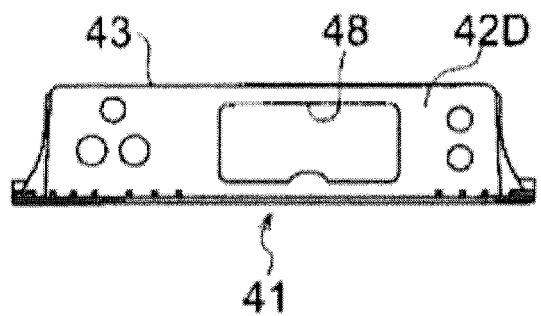

On outer surfaces of the side wall portions 42A, 42B, and 42C among the plurality of side wall portions 42A through 42D, a plurality of ribs 45 that extend in a thickness direction of the housing 40, for example, in an arrow T direction, are formed, respectively. On the bottom wall portion 43, as illustrated in FIG. 2B, a reinforcing portion 46 in a honeycomb pattern that spreads in a height direction and a transverse width direction of the housing 40, for example, in an arrow H direction and an arrow W direction, is formed. The base station 10 having the housing 40 is installed outdoors in such a manner that the height direction of the housing 40 agrees with the vertical direction.

The side wall portion 42D (lower wall portion) located in a lower end portion of the housing 40 among the plurality of side wall portions 42A through 42D is provided with a plurality of connectors 47 as illustrated in FIG. 1. All of the plurality of connectors 47 are electrically coupled to the electronic unit 20.

Figure 3:
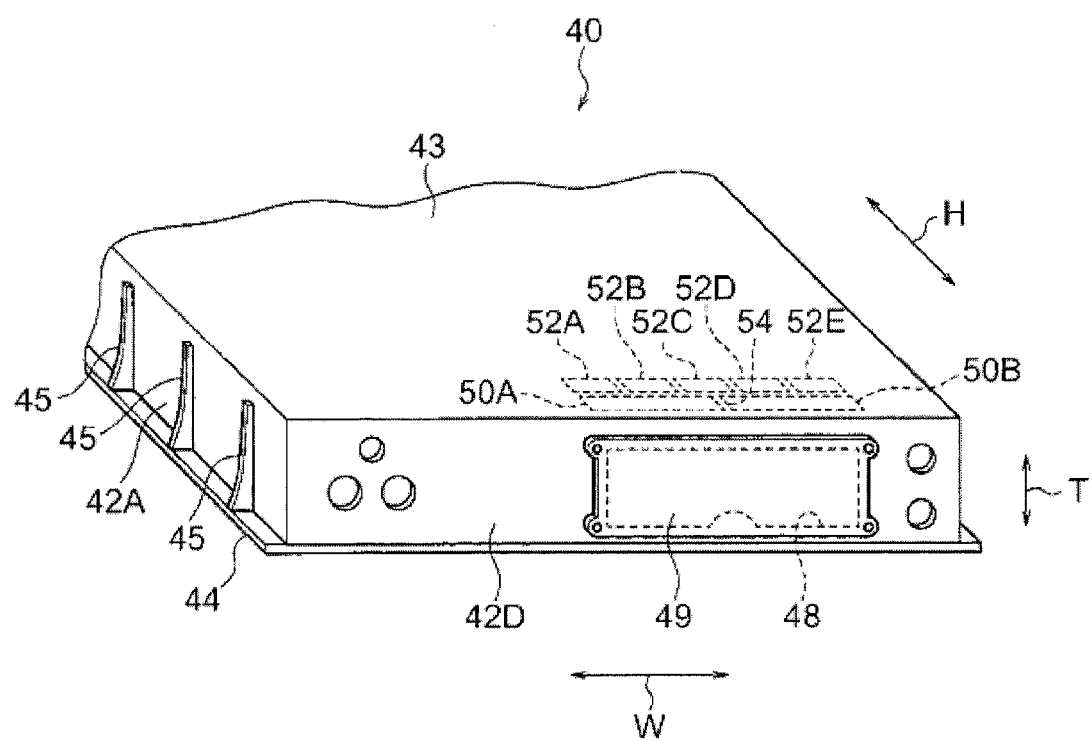
FIG. 3 illustrates an exemplary perspective view of a housing.

FIG. 3 illustrates an exemplary perspective view of a housing. In FIG. 3, an enlarged perspective view of a main part of the housing is illustrated. In the side wall portion 42D, as illustrated in FIG. 3, an opening portion 48 for maintenance is formed. The opening portion 48 has a rectangular shape in which the transverse width direction of the housing 40 is a longitudinal direction, and is covered with a lid material 49 made of metal. Both between the opening portion 48 for maintenance and the lid material 49 and between the opening portion 41 of the housing 40 and the heat sink 30 may be tightly sealed with a sealing material or the like, not illustrated.

In a portion on a side wall portion 42D side in the bottom wall portion 43, a pair of notches 50A and 50B is formed. The pair of notches 50A and 50B may be located in a transverse width direction of the opening portion 48, for example, on both sides across a central portion in the arrow W direction. In the bottom wall portion 43, a plurality of auxiliary notches 52A through 52E are formed in a portion on a side opposite to the side wall portion 42D relative to the pair of notches 50A and 50B.

The plurality of auxiliary notches 52A through 52E are formed in alignment in an arrangement direction of the pair of notches 50A and 50B, for example, in the arrow W direction, which is the transverse width direction of the housing 40. Between the pair of notches 50A and 50B, a convex portion 54 is formed. The position of the convex portion 54 in the arrangement direction of the pair of notches 50A and 50B, for example, in the arrow W direction, may substantially agree with the position of the auxiliary notch 52C at the center of the plurality of auxiliary notches 52A through 52E.

Figure 4:
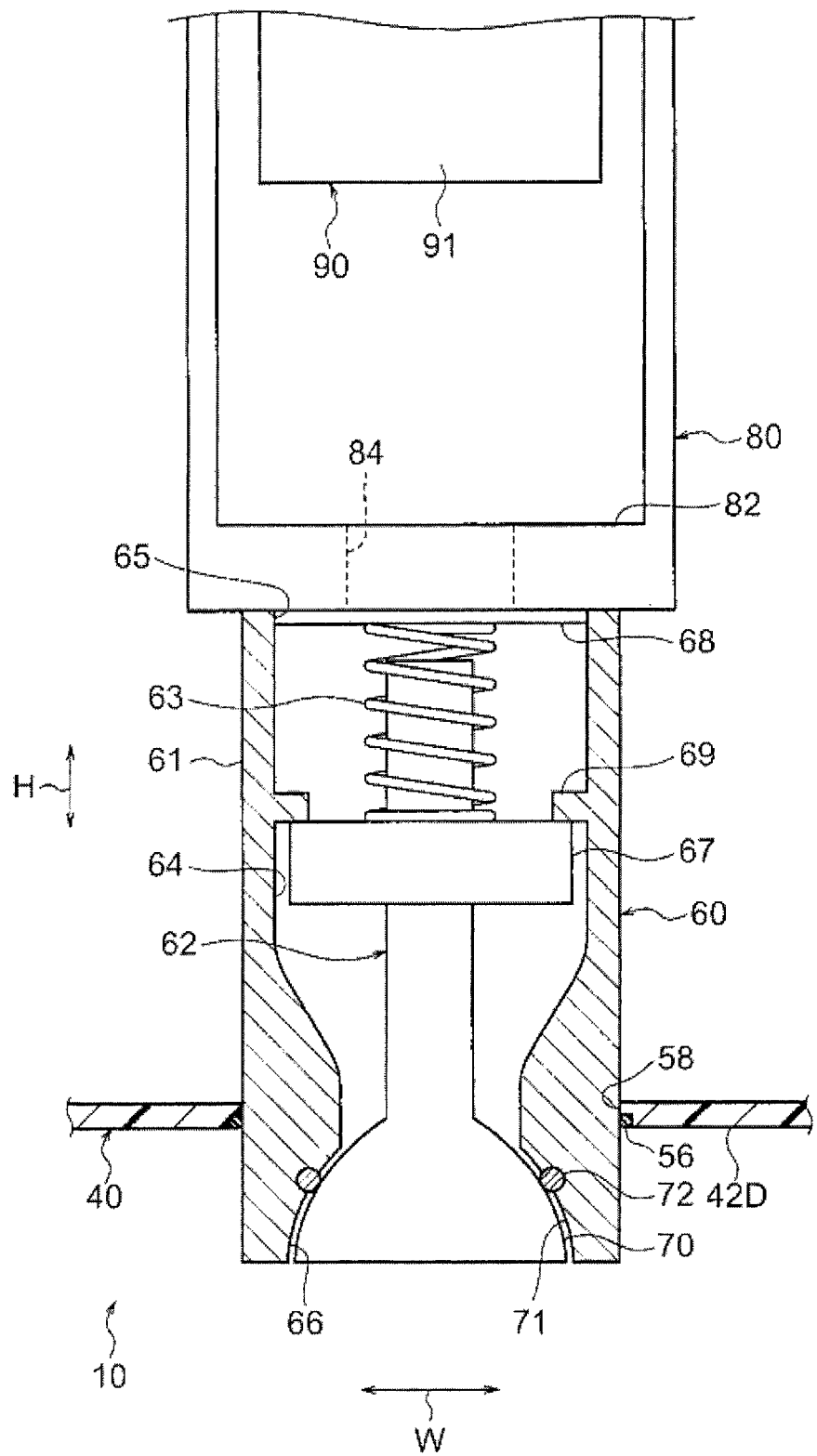
FIG. 4 illustrates an exemplary longitudinal sectional view of a base station.

FIG. 4 illustrates an exemplary longitudinal sectional view of a base station. As illustrated in FIG. 4, the valve 60 may penetrate the side wall portion 42D (lower wall portion) that is formed in the housing 40. The valve 60 includes an outer cylinder 61, a movable member 62, and a spring 63. The outer cylinder 61 may be placed in such a manner that an axial direction substantially agrees with the height direction of the housing 40. An outer peripheral surface of the outer cylinder 61 is provided with an O ring 56. By the O ring 56, waterproofness between an inner peripheral surface of a through hole 58 in the side wall portion 42D that is penetrated by the outer cylinder 61 and the outer peripheral surface of the outer cylinder 61 may be secured.

In the outer cylinder 61, a communication channel 64 that penetrates in the axial direction is formed. The communication channel 64 communicates the inside of the housing 40 with the outside. The opening in the internal side of the housing 40 in the communication channel 64 may be an inlet 65 of the valve 60. The opening in the external side of the housing 40 in the communication channel 64 may be an outlet 66 of the valve 60. The outlet 66 of the valve 60 may be directed to a lower side in the height direction (lower side in the vertical direction) of the housing 40.

The movable member 62 may be placed movably in the axial direction of the outer cylinder 61 inside the communication channel 64. In the central portion of the movable member 62 in the axial direction, an expanded diameter portion 67 that has a diameter smaller than that of the communication channel 64 is formed. The peripheral portion of the inlet 65 is provided with an annular regulating member 68. One end of the spring 63 is fixed to the regulating member 68. The other end of the spring 63 is fixed to the expanded diameter portion 67. The spring 63 gives tension to the expanded diameter portion 67. The expanded diameter portion 67 is locked in a stopper portion 69 that is formed in the outer cylinder 61 by being pulled by the spring 63.

At a tip end portion of the movable member 62, a valve portion 70 is formed. In a portion of the communication channel 64 on an outlet 66 side, a valve sheet 71 is formed. The valve sheet 71 is provided with a gasket 72. In a state that the expanded diameter portion 67 is locked in the stopper portion 69, the valve portion 70 is closely attached to the gasket 72 and the space between the valve portion 70 and the valve sheet 71 is tightly sealed. For example, the communication channel 64 may be blocked.

In a case that an internal pressure of the housing 40 exceeds a prescribed value, the expanded diameter portion 67 is subjected to the internal pressure of the housing 40. Therefore, the entire movable member 62 including the expanded diameter portion 67 moves against the tension of the spring 63. As the movable member 62 moves, a gap is created between the valve portion 70 and the valve sheet 71, and the communication channel 64 is released. The regulating member 68 may be movable in the axial direction of the outer cylinder 61. By the movement of the regulating member 68, the tension of the spring 63 or the prescribed value of the internal pressure of the housing 40 to release the communication channel 64 may be altered.

Figure 5:
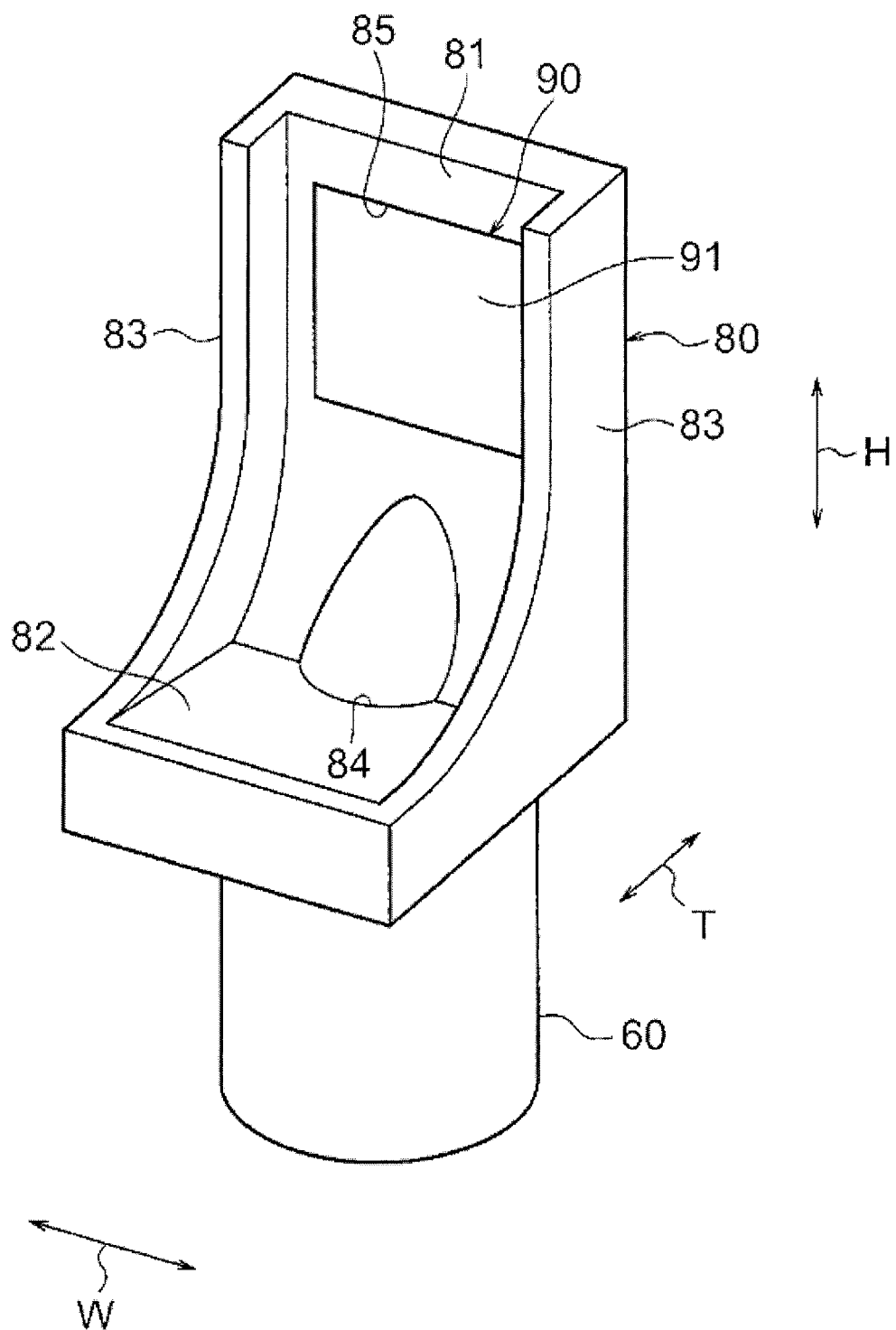
FIG. 5 illustrates an exemplary perspective view of a guide member and a valve.
Figure 6:
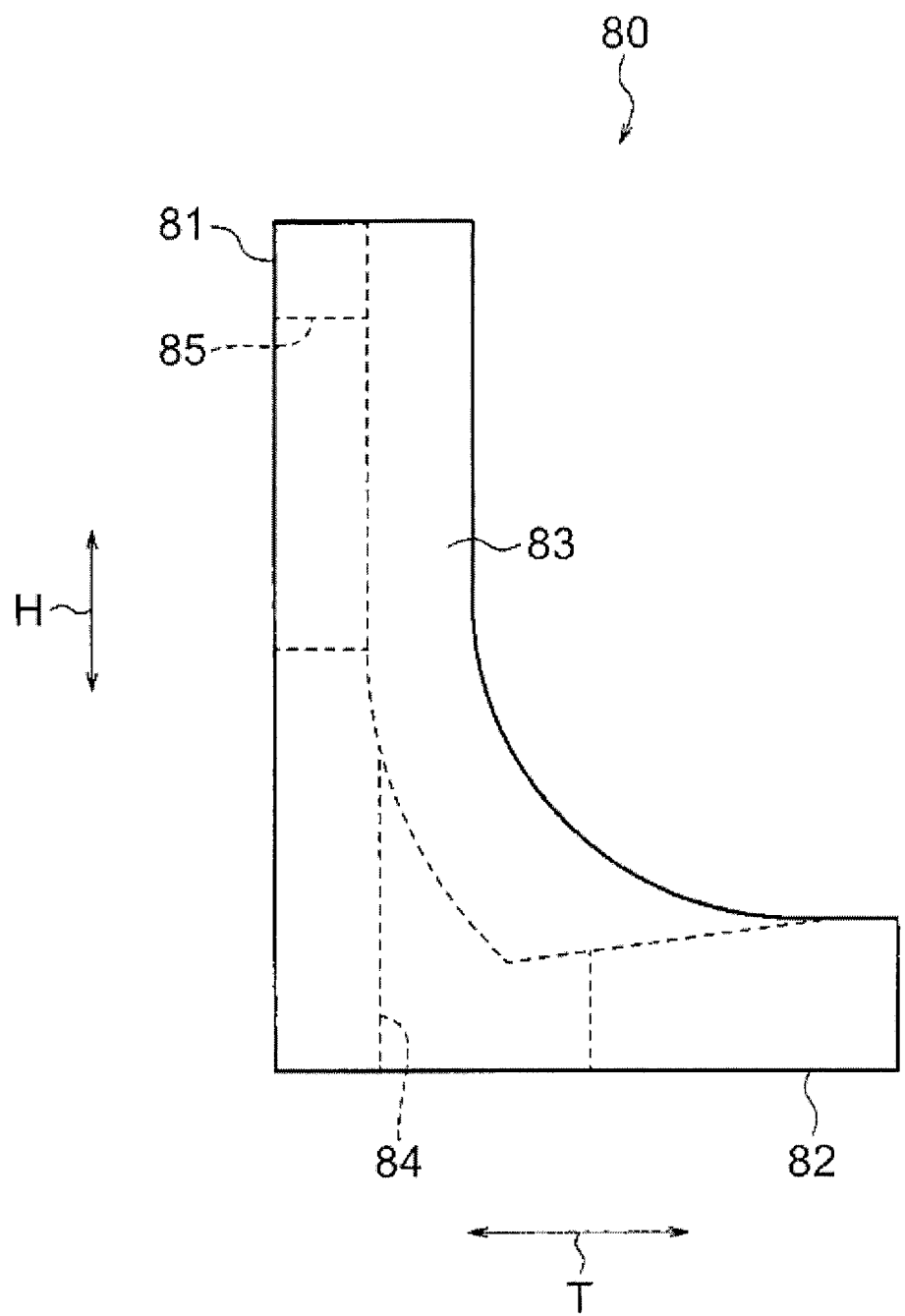
FIG. 6 illustrates an exemplary side view of the guide member.

FIG. 5 illustrates an exemplary perspective view of a guide member and a valve. FIG. 6 illustrates an exemplary side view of a guide member. The guide member and the valve illustrated in FIG. 5 may be the guide member and the valve illustrated in FIG. 1. The guide member illustrated in FIG. 6 may be the guide member illustrated in FIG. 1. The guide member 80 is provided inside the housing 40 and is mounted integrally to the valve 60. The guide member 80 may be placed in such a manner that the height direction agrees with the height direction of the housing 40. As illustrated in FIGS. 5 and 6, the guide member 80 includes a standing wall portion 81 that extends in the height direction and a lower wall portion 82 that is bent from the lower end portion of the standing wall portion 81, and has an approximate L shape in a side view. In side portions of the guide member 80, guide walls 83 that protrude to the tip end portion side of the lower wall portion 82 are formed, respectively. The guide walls 83 may be formed from an upper end portion of the standing wall portion 81 over the tip end portion of the lower wall portion 82.

In the lower wall portion 82, a guide hole 84 that penetrates along the height direction of the guide member 80 is formed. The guide hole 84 may be coupled to, for example, an inlet 65 of the valve 60 illustrated in FIG. 4. The lower wall portion 82 is formed on a slant so as to be directed towards an upper side in the height direction of the guide member 80 as getting closer to the tip end portion side. In an upper portion of the standing wall portion 81, an accommodation portion 85 that penetrates in a plate thickness direction is formed. Hydrophilic treatment or water repellent treatment may also be applied on the guide member 80.

Figure 7:
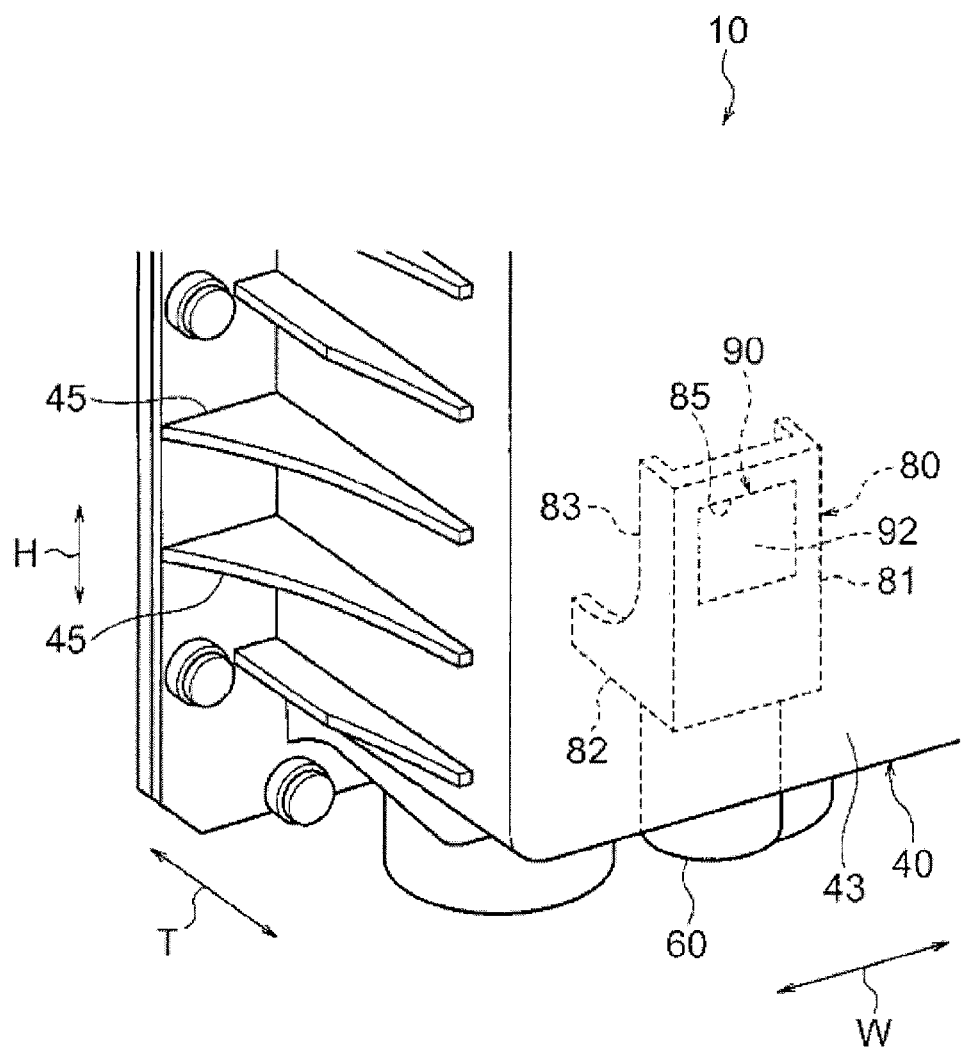
FIG. 7 illustrates an exemplary enlarged perspective view of a base station.

As illustrated in FIG. 5, the Peltier element 90 is held by the guide member 80 in a state of being accommodated in the accommodation portion 85. A cooling surface 91 of the Peltier element 90 may be a low temperature portion and is exposed inside the housing 40. FIG. 7 illustrates an exemplary enlarged perspective view of a base station. The base station illustrated in FIG. 7 may be the base station illustrated in FIG. 1. As illustrated in FIG. 7, a heating surface 92 of the Peltier element 90 is coupled to the bottom wall portion 43 of the housing 40. The heating surface 92 may also be coupled directly to the bottom wall portion 43, and may also be coupled via a member, such as a thermally conductive adhesive.

The temperature humidity sensor 100 illustrated in FIG. 1 may be provided in the central portion in the height direction inside the housing 40. A detection signal from the temperature humidity sensor 100 is output to a control portion 102. The control portion 102 calculates a dew point inside the housing 40 based on the detection signal output from the temperature humidity sensor 100. The control portion 102 controls the Peltier element 90 in such a manner that the Peltier element 90 becomes lower in temperature than the dew point inside the housing 40.

As the cooling surface 91 illustrated in FIG. 4 is cooled based on driving of the Peltier element 90, dew condensation water is produced on the cooling surface 91. The dew condensation water is guided to the inlet 65 of the valve 60 by the guide member 80. For example, after falling down the standing wall portion 81 of the guide member 80, the dew condensation water produced on the cooling surface 91 may be guided through the guide hole 84 to the inlet 65 of the valve 60.

For example, the housing 40 of the base station 10 is provided with the valve 60 that has the communication channel 64 communicating the inside of the housing 40 with the outside. In a case that the internal pressure of the housing 40 exceeds a prescribed value, the valve 60 opens the communication channel 64.

Therefore, even when the internal pressure of the housing 40 increases due to a change in the surrounding environment temperature, in a case that the internal pressure of the housing 40 exceeds the prescribed value, an air inside the housing 40 is discharged to outside. Stress strain of the housing 40 which is made of a resin, based on the change in internal pressure may be reduced, and deformation of the housing 40 may also be reduced. Damage or defects in waterproofness in association with variation in internal pressure of the housing 40 may be reduced to improve the protection performance of the electronic unit 20 that is accommodated inside the housing 40.

On the plurality of side wall portions 42A through 42C, the plurality of ribs 45 that extend in the thickness direction of the housing 40, for example, in the arrow T direction, are formed. By the plurality of ribs 45, deformation in association with variation in internal pressure of the housing 40 may be reduced. In the bottom wall portion 43, the reinforcing portion 46 in a honeycomb pattern that spreads in the height direction and the transverse width direction of the housing 40, for example, in the arrow H direction and the arrow W direction, is formed. By the reinforcing portion 46, deformation in association with variation in internal pressure of the housing 40, for example, deformation of the bottom wall portion 43 having a large area may be reduced.

The Peltier element 90 is provided inside the housing 40. The Peltier element 90 may be controlled in such a manner that the cooling surface 91 becomes lower in temperature than the dew point inside the housing 40. The dew condensation water produced on the cooling surface 91 is guided to the inlet 65 of the valve 60 by the guide member 80, and is discharged to outside the housing 40 together with an air inside the housing 40 when the communication channel 64 is released. Therefore, in a case that a moisture permeation phenomenon occurs in the housing 40 made of a resin, humidity inside the housing 40 may decrease. Troubles, such as defects in insulation of the electronic unit 20 that is accommodated in the housing 40, may be reduced.

Since the dew condensation water produced on the cooling surface 91 is guided to the inlet 65 of the valve 60 by the guide member 80, the dew condensation water is smoothly discharged to outside the housing 40. For example, in the side portions of the guide member 80, the guide walls 83 that protrude to the tip end portion side of the lower wall portion 82 are formed, respectively. The lower wall portion 82 is formed on a slant so as to be directed towards the upper side in the height direction of the guide member 80 as getting closer to the tip end portion side. Therefore, since the dew condensation water falling down the standing wall portion 81 is smoothly guided to the guide hole 84, the dew condensation water may be smoothly discharged to outside the housing 40.

In the opened communication channel 64, an air flows from inside the housing 40 to outside. The outlet 66 of the valve 60 is directed to the lower side in the height direction of the housing 40, for example, to the lower side in the vertical direction. Therefore, it may be reduced that a foreign substance, a water droplet, and the like enter from the outlet 66 of the valve 60 while the communication channel 64 is opened.

In a case that there is no pressure difference between inside and outside the housing 40, the movable member 62 returns to the home position by the tension of the spring 63. The valve portion 70 is closely attached with the gasket 72 and the communication channel 64 is blocked. In a case that the internal pressure of the housing 40 is not more than a prescribed value as well, it may be reduced that a foreign substance, a water droplet, and the like enter inside the housing 40.

The heating surface 92 of the Peltier element 90 is coupled to the housing 40. Therefore, since heat is not easily transferred directly to the electronic unit 20, heating of the electronics and the like that have implemented in the electronic unit 20 may be reduced.

In a portion on the side wall portion 42D side in the bottom wall portion 43, the pair of notches 50A and 50B is formed. The pair of notches 50A and 50B is located on both sides across the central portion in the transverse width direction of the opening portion 48. Therefore, even when the lid material 49 that covers the opening portion 48 is made of metal having a linear expansion coefficient lower than that of the housing 40 made of a resin, thermal deformation in a surrounding area of the opening portion 48 may be reduced by the pair of notches 50A and 50B. Tight sealability between the opening portion 48 for maintenance and the lid material 49 may be secured.

For example, in the bottom wall portion 43, the plurality of auxiliary notches 52A through 52E are formed in a portion on a side opposite to the side wall portion 42D relative to the pair of notches 50A and 50B. The position of the convex portion 54 in the arrangement direction of the pair of notches 50A and 50B, for example, in the arrow W direction may substantially agree with the position of the auxiliary notch 52C at the center of the plurality of auxiliary notches 52A through 52E. By the plurality of auxiliary notches 52A through 52E, the thermal deformation in the surrounding area of the opening portion 48 is reduced.

Figure 8:
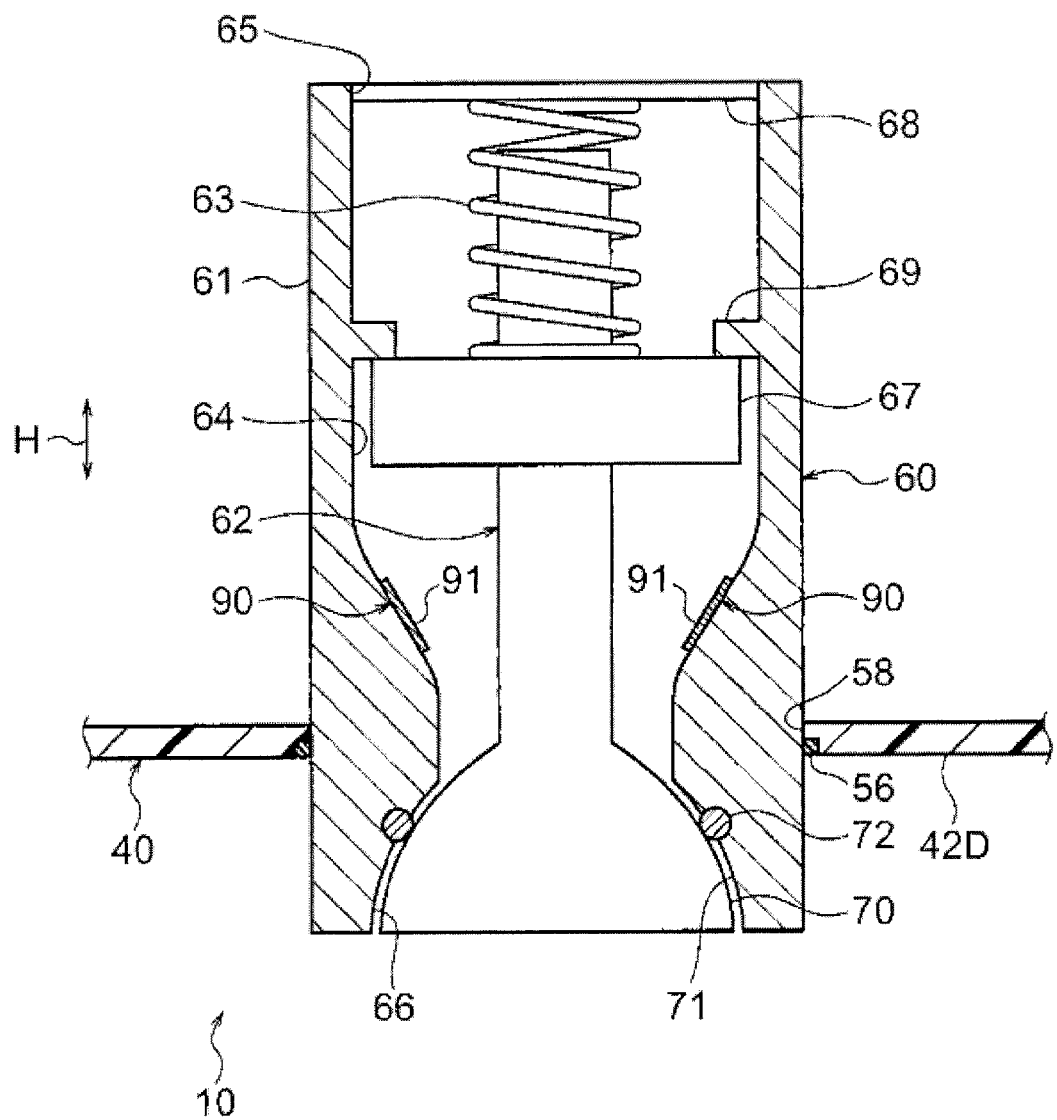
FIG. 8 illustrates an exemplary valve.

FIG. 8 illustrates an exemplary valve. In the base station 10 illustrated in FIG. 1, the Peltier element 90 is held by the guide member 80. In FIG. 8, the Peltier element 90 may be mounted to an inner wall surface of the communication channel 64 on an upstream side than the valve portion 70.

In the base station 10 illustrated in FIG. 1, the ribs 45 are formed in the side wall portions 42A through 42C among the plurality of side wall portions 42A through 42D. As illustrated in FIG. 8, the ribs 45 may also be formed in at least one side wall portion among the plurality of side wall portions 42A through 42D.

The reinforcing portion 46 that is formed in the bottom wall portion 43 may also have a honeycomb pattern that spreads in the height direction and the transverse width direction of the housing 40, and may also have other patterns, such as a grid pattern or a zigzag pattern that spreads in the height direction and the transverse width direction of the housing 40.

While the Peltier element 90 is used to produce dew condensation water in the base station 10 illustrated in FIG. 1, other members may also be used.

Figure 9:
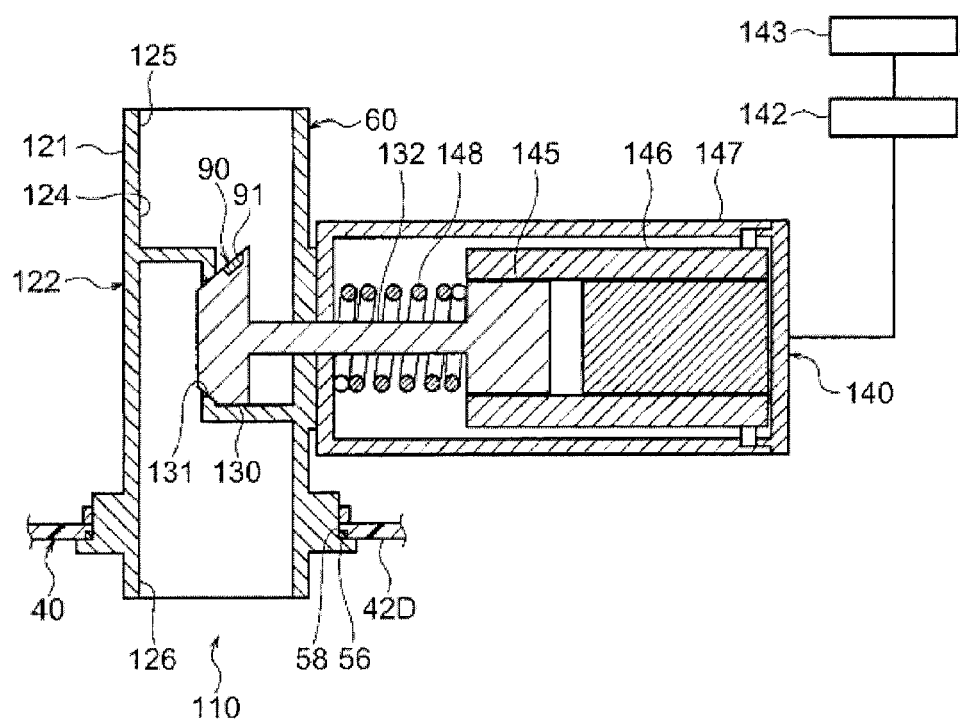
FIG. 9 illustrates an exemplary longitudinal sectional view of a base station.

FIG. 9 illustrates an exemplary longitudinal sectional view of a base station. In FIG. 9, a main part of the base station is illustrated. A base station 110 (hereinafter, abbreviated as a base station 110) illustrated in FIG. 9 may have a valve configuration that is different from a configuration of the valve 60 of the base station 10 illustrated in FIG. 1.

The valve 60 illustrated in FIG. 9 may be an electromagnetic type and includes a valve main body 122 having an outer cylinder 121, a valve portion 130, and an actuator 140.

The outer cylinder 121 is placed in such a manner that an axial direction substantially agrees with the height direction of the housing 40. An outer peripheral surface of the outer cylinder 121 may be provided with an O ring 56 as illustrated in FIG. 9. By the O ring 56, waterproofness between an inner peripheral surface of a through hole 58 in the side wall portion 42D that is penetrated by the outer cylinder 121 and the outer peripheral surface of the outer cylinder 121 may be secured.

In the outer cylinder 121, a communication channel 124 that penetrates in the axial direction is formed. The communication channel 124 communicates the inside of the housing 40 with the outside. The opening in the internal side of the housing 40 of the communication channel 124 may be an inlet 125 of the valve 60. The opening in the external side of the housing 40 in the communication channel 124 may be an outlet 126 of the valve 60. The outlet 126 of the valve 60 is directed to a lower side in the height direction, for example, the lower side in the vertical direction of the housing 40.

The valve portion 130 is placed movably in a radial direction of the communication channel 124 inside the communication channel 124. The valve portion 130 is coupled to a movable core 145 of the actuator 140 via a rod 132 and is moved in association with driving of the actuator 140. The actuator 140 may be an electromagnetic type that includes the movable core 145, a coil 146, a case 147, and a spring 148, and is coupled to a control portion 142. To the control portion 142, a pressure sensor 143 that outputs a signal in accordance with the internal pressure of the housing 40 is coupled.

In a position corresponding to the valve portion 130 of the communication channel 124, a valve sheet 131 is provided. The actuator 140 is driven by the control portion 142. In a state that the valve portion 130 is advanced by the actuator 140, the valve portion 130 is closely attached to the valve sheet 131, and the space between the valve portion 130 and the valve sheet 131 becomes in a state of being tightly sealed. For example, the communication channel 124 is blocked.

In a case that the internal pressure of the housing 40 exceeds a prescribed value, the actuator 140 is driven by the control portion 142 and the valve portion 130 retracts. A gap is created between the valve portion 130 and the valve sheet 131 based on the retraction of the valve portion 130, and the communication channel 124 is released.

In a case that the internal pressure of the housing 40 exceeds the prescribed value, an air inside the housing 40 is discharged to outside. Therefore, stress strain of the housing 40 made of a resin due to a change in internal pressure or deformation of the housing 40 may be reduced. Since damage or defects in waterproofness in association with variation in internal pressure of the housing 40 is reduced, the protection performance of the electronic unit 20 that is accommodated inside the housing 40 may also be improved.

The Peltier element 90 is mounted to a site on an upstream side than a contact area with the valve sheet 131 of the valve portion 130. For example, the Peltier element 90 may also be held by the guide member 80 (refer to FIGS. 1 through 7) mounted to the valve 60.

Figure 10:
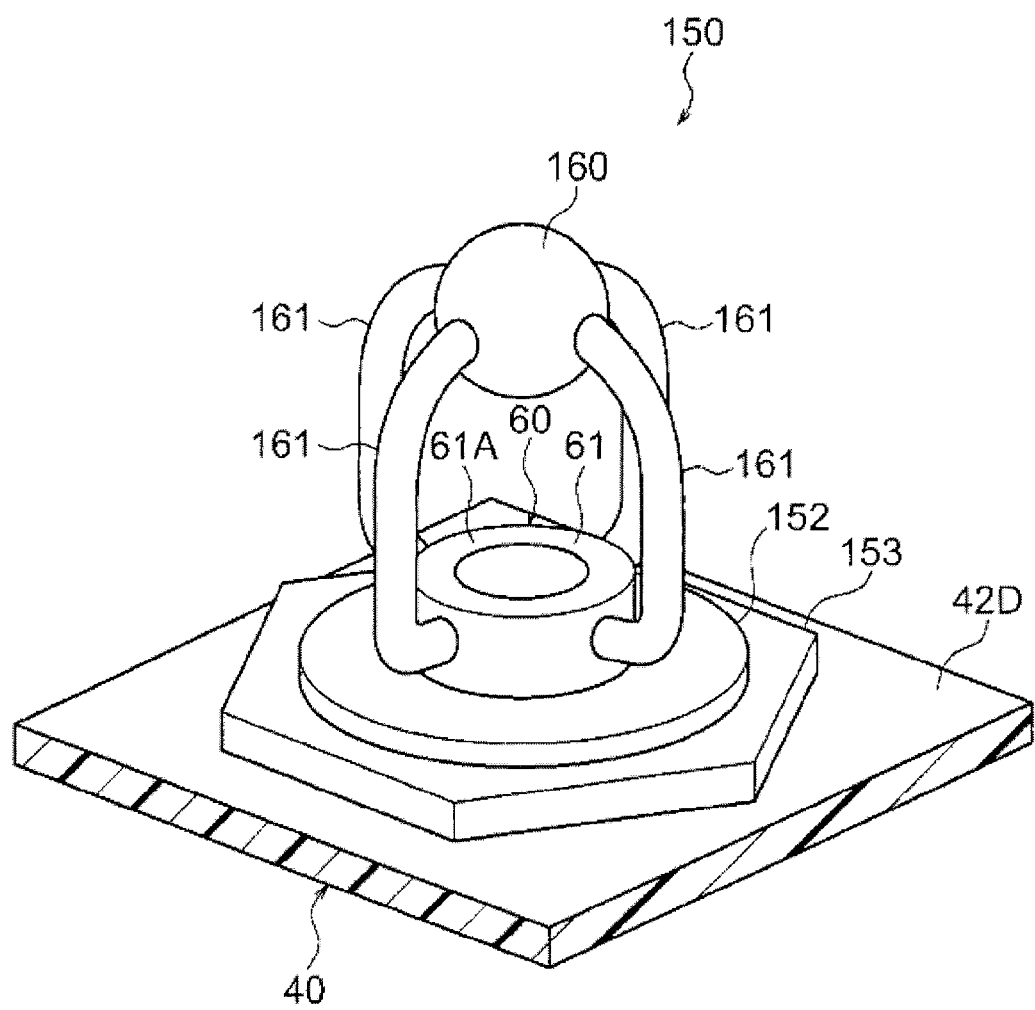
FIG. 10 illustrates an exemplary perspective view of a base station.
Figure 11:
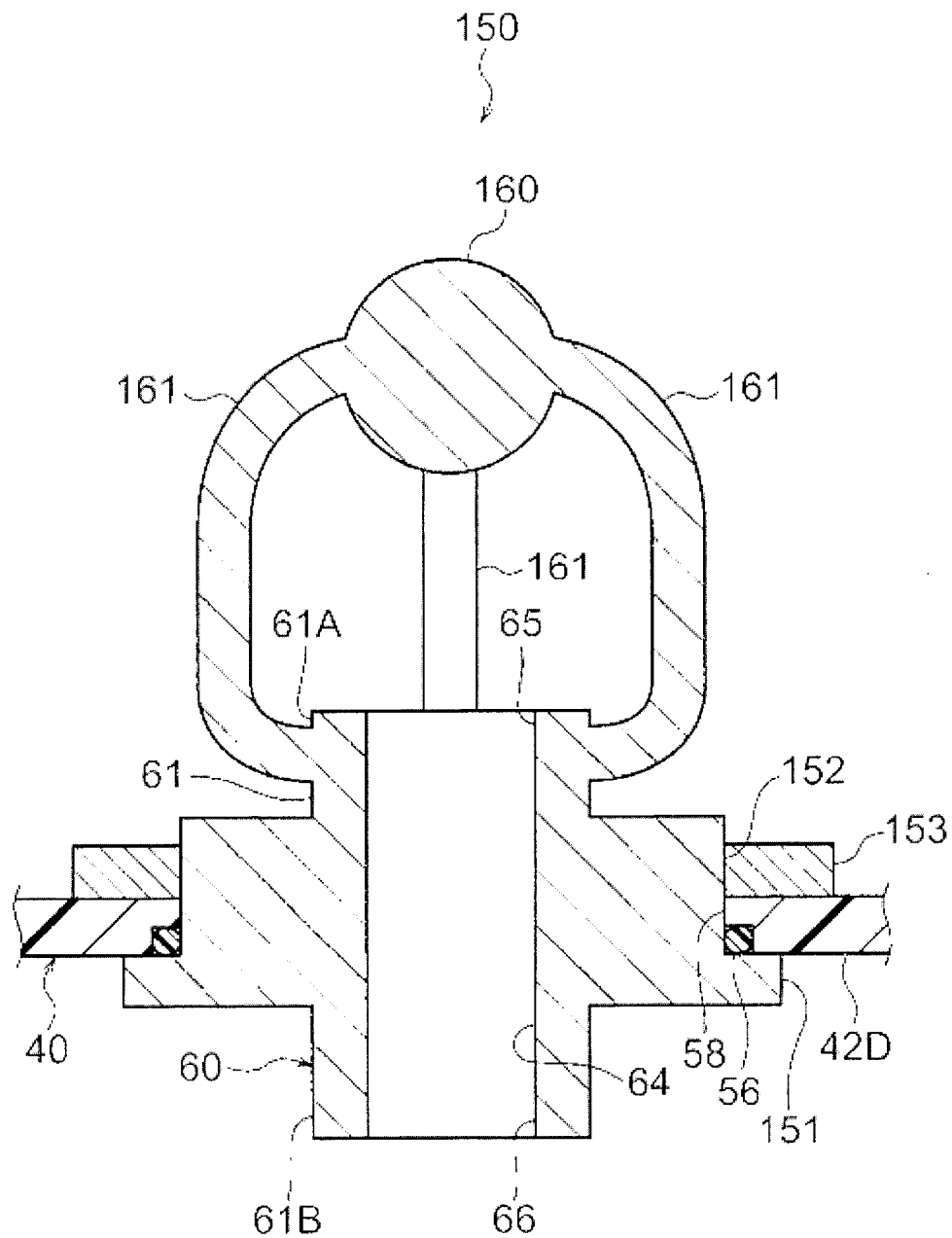
FIG. 11 illustrates an exemplary longitudinal sectional view of a base station.

FIG. 10 illustrates an exemplary perspective view of a base station. FIG. 11 illustrates an exemplary longitudinal sectional view of an base station. In FIG. 11, a longitudinal sectional view of a main part of the base station illustrated in FIG. 10 may be illustrated.

In a base station 150 (hereinafter, abbreviated as a base station 150) illustrated in FIGS. 10 and 11, a spherical metal body 160 is used instead of the Peltier element 90 illustrated in FIG. 1. The metal body 160 may include a material having a high thermal conductivity, for example, aluminum, an aluminum alloy, copper, or the like. The metal body 160 is supported by an upper portion 61A of the outer cylinder 61 via support members 161 and is placed above the valve 60.

In the outer cylinder 61 of the valve 60, as illustrated in FIG. 11, a flange portion 151 and a threaded portion 152 are formed. To the threaded portion 152, a nut 153 is screwed. Since the side wall portion 42D is sandwiched by the nut 153 and the flange portion 151, the valve 60 is fixed to the side wall portion 42D.

The upper portion 61A of the outer cylinder 61 is inserted inside the housing 40, and a lower portion 61B of the outer cylinder 61 is exposed to outside the housing 40. The upper portion 61A of the outer cylinder 61 may be a part of the outer cylinder. The lower portion 61B of the outer cylinder 61 may be another part of the outer cylinder. In FIG. 11, a member inside the valve 60, for example, the valve portion 70, the valve sheet 71, and the like illustrated in FIG. 4 may be omitted.

As the metal body 160 becomes lower in temperature than the dew point inside the housing 40, dew condensation water is produced on a surface of the metal body 160. In a case that the internal pressure of the housing 40 exceeds a prescribed value, the communication channel 64 of the valve 60 is opened and the dew condensation water is discharged to outside the housing 40 together with an air inside the housing 40. Therefore, even in a case that a moisture permeation phenomenon occurs in the housing 40 made of a resin, the humidity inside the housing 40 decreases. Troubles, such as defects in insulation of the electronic unit 20 that is accommodated in the housing 40, may be reduced.

Since a simple structure using the metal body 160 is employed, the costs may be reduced.

While the metal body 160 is supported by the valve 60 via the support members 161, it may also be supported by other members, such as the housing 40, for example.

The metal body 160 may also have a spherical shape and may also have other shapes.

The valve 60 may also be an electromagnetic type.

The outer cylinder 61 of the valve 60, the metal body 160, and the support members 161 may include an identical material that has thermal conductivity, for example, aluminum, an aluminum alloy, copper, or the like. Since a part of the outer cylinder 61 is exposed to outside the housing 40, the heat of an ambient air is introduced by thermal conduction and a continuous difference in temperature may occur in the metal body 160.

Figure 12:
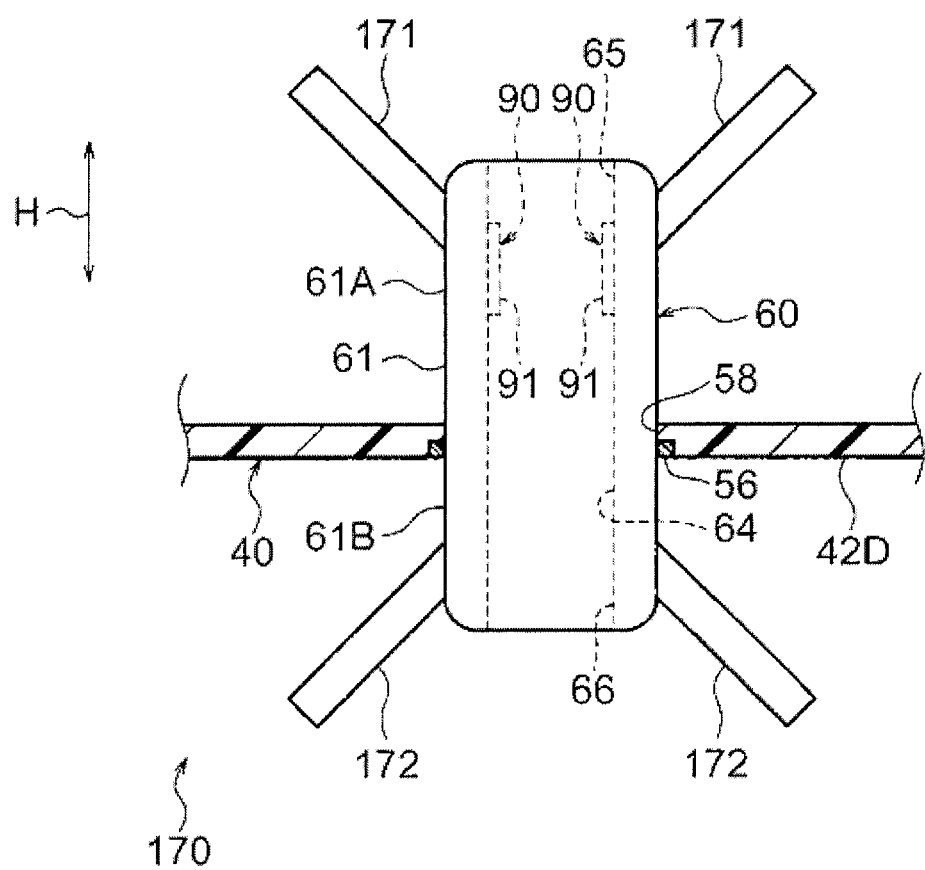
FIG. 12 illustrates an exemplary longitudinal sectional view of a base station.

FIG. 12 illustrates an exemplary longitudinal sectional view of a base station.

In a base station 170 (hereinafter, abbreviated as a base station 170) illustrated in FIG. 12, the Peltier element 90 is mounted to an inner wall surface of the communication channel 64. The outer cylinder 61 of the valve 60 may be made of metal. The outer cylinder 61 may include a material having a high thermal conductivity, for example, aluminum, an aluminum alloy, copper, or the like. The upper portion 61A of the outer cylinder 61 is inserted inside the housing 40. The lower portion 61B of the outer cylinder 61 is exposed to outside the housing 40. An upper end portion and a lower end portion of the outer cylinder 61 are provided with a pair of fins 171 and a pair of fins 172, respectively. The upper portion 61A of the outer cylinder 61 may be a part of the outer cylinder. The lower portion 61B of the outer cylinder 61 may be another part of the outer cylinder.

As the lower portion 61B of the outer cylinder 61 is cooled by an ambient air and the upper portion 61A of the outer cylinder 61 becomes lower in temperature than the dew point inside the housing 40, dew condensation water is produced on a surface of the upper portion 61A of the outer cylinder 61.

The Peltier element 90 is driven to cool the cooling surface 91. As the cooling surface 91 becomes lower in temperature than the dew point inside the housing 40, dew condensation water is produced on the cooling surface 91. In FIG. 12, illustration of a member inside the valve 60, for example, the valve portion 70, the valve sheet 71, and the like illustrated in FIG. 4 may be omitted.

In a case that the internal pressure of the housing 40 exceeds a prescribed value, the communication channel 64 of the valve 60 is opened. The dew condensation water is discharged to outside the housing 40 together with an air inside the housing 40. When a moisture permeation phenomenon occurs in the housing 40 made of a resin, the humidity inside the housing 40 decreases. Therefore, development of troubles, such as defects in insulation of the electronic unit 20 that is accommodated in the housing 40, may be reduced.

Since the outer cylinder 61 of the valve 60 is utilized as a low temperature portion to produce dew condensation water, cost reduction may be achieved.

Since the upper end portion of the outer cylinder 61 is provided with the pair of fins 171, a heat transfer coefficient of the upper portion of the outer cylinder 61 may be improved. Since the lower end portion of the outer cylinder 61 is provided with the pair of fins 172, the outer cylinder 61 may be cooled. An amount of producing the dew condensation water in the upper portion 61A of the outer cylinder 61 may increase.

The inner wall surface of the communication channel 64 may also be provided with the Peltier element 90 and may also not be provided with it.

The valve 60 may be an electromagnetic type.

Figure 13:
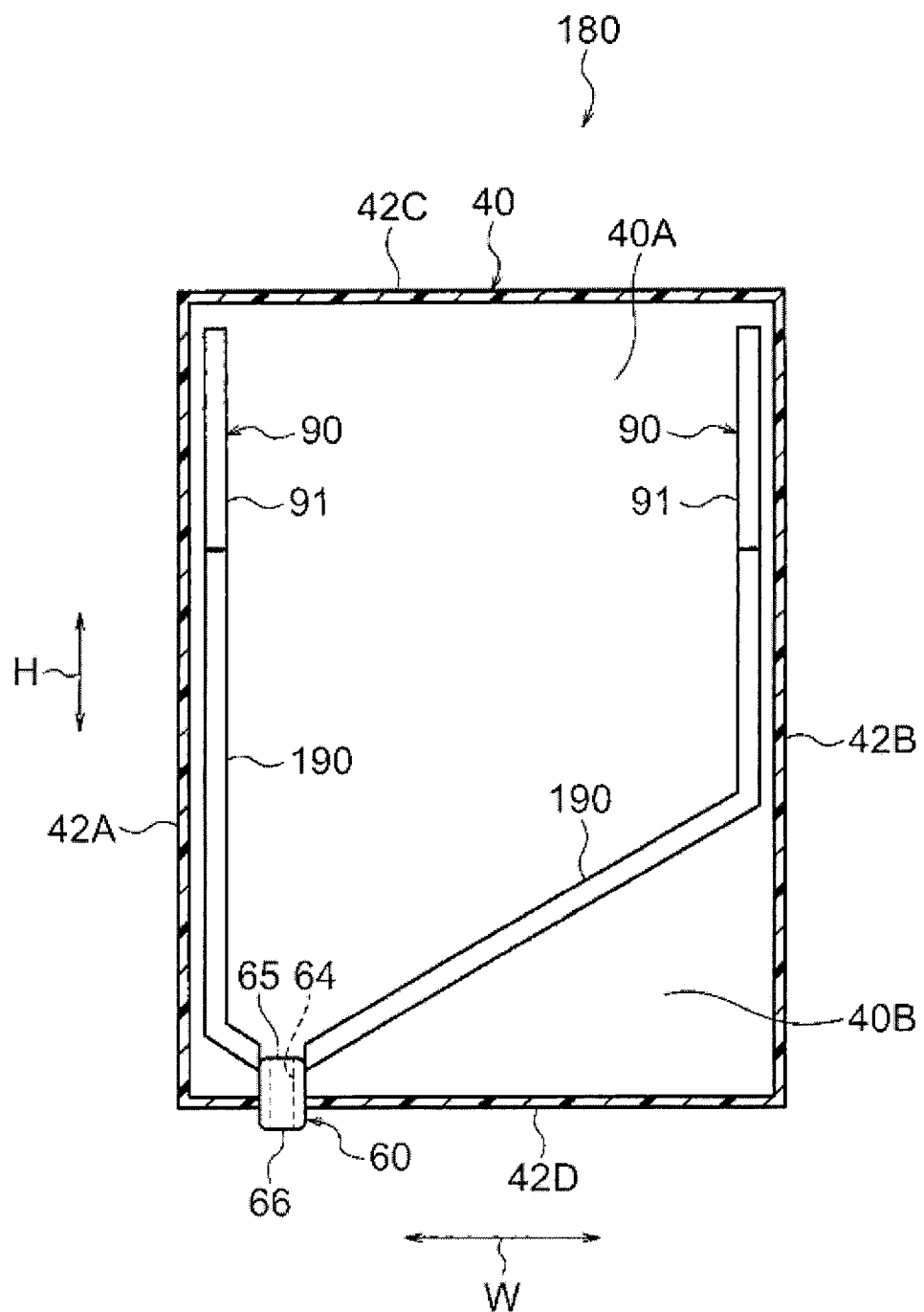
FIG. 13 illustrates an exemplary longitudinal sectional view of a base station.

FIG. 13 illustrates an exemplary longitudinal sectional view of a base station.

In a base station 180 (hereinafter, abbreviated as a base station 180) illustrated in FIG. 13, the Peltier element 90 is provided in an upper portion 40A inside the housing 40. Inside the housing 40 is provided with a guide portion 190 that guides dew condensation water produced on the cooling surface 91 of the Peltier element 90 to the inlet 65 of the valve 60 that is provided in a lower portion of the housing 40. The guide portion 190 may be formed integrally with the housing 40 made of a resin and may also be mounted to the housing 40 as a separated body.

The Peltier element 90 is provided in the upper portion 40A inside the housing 40. Since a warm air rises, the upper portion 40A inside the housing 40 may be higher in temperature than a lower portion 40B. Due to a water vapor pressure difference, more dew condensation water may be produced on the cooling surface 91 of the Peltier element 90. Therefore, the humidity inside the housing 40 may decrease more. The lower portion 40B inside the housing 40 may be another region. The upper portion 40A inside the housing 40 may be one example of a region that is higher in temperature than other regions.

Between the Peltier element 90 and the valve 60, the guide portion 190 is provided. By the guide portion 190, the dew condensation water produced on the cooling surface 91 of the Peltier element 90 is guided to the inlet 65 of the valve 60. Therefore, the dew condensation water may be smoothly discharged to outside the housing 40.

The Peltier element 90 may be provided in the upper portion 40A inside the housing 40 and may also be placed in a region that is higher in temperature than other regions inside the housing 40. The region that is higher in temperature than other regions inside the housing 40 may include, for example, the upper portion 40A inside the housing 40, a region for placement of a heat generating component of the electronic unit 20, or the like.

In FIG. 10 as well, the metal body 160 may also be placed in a region that is higher in temperature than other regions inside the housing 40. In FIG. 12 as well, the upper portion 61A of the outer cylinder 61 may also be placed in a region that is higher in temperature than other regions inside the housing 40.

The valve 60 may be an electromagnetic type.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A base station comprising:
    an electronic unit;
    a housing including a resin and configured to accommodate the electronic unit;
    a valve provided in the housing, the valve being configured to include a communication channel for communicating an inside of the housing with an outside and to open the communication channel when an internal pressure of the housing exceeds a value;
    a low temperature portion provided inside the housing and configured to become lower in temperature than a dew point inside the housing; and
    a guide member configured to hold a Peltier element included in the low temperature portion and to guide dew condensation water produced on a cooling surface of the Peltier element to an inlet of the valve.

2. The base station according to claim 1, wherein the valve is configured to include an outer cylinder made of metal, the valve being configured to include a part that is to be inserted inside the housing and another part that is to be exposed to the outside of the housing, and the low temperature portion includes the part of the outer cylinder.

3. The base station according to claim 1, wherein the low temperature portion includes a cooling surface of a Peltier element whose heating surface is coupled to the housing.

4. The base station according to claim 1, wherein:
    an opening portion for maintenance that is covered with a lid material made of metal is formed in at least one of a plurality of side wall portions that are formed in the housing, and
    a pair of notches are formed to be located on both sides across a central portion of in a transverse width direction of the opening portion in a portion on at least one of the plurality of side wall portions in a bottom wall portion that is formed in the housing and is surrounded by the plurality of side wall portions.

5. The base station according to claim 1, wherein:
    the guide member includes a standing wall portion that extends in a height direction, a lower wall portion that is bent from a lower end portion of the standing wall portion, and a guide wall that protrudes from a side portion of the guide member to a tip end portion side of the lower wall portion and is formed from an upper end portion of the standing wall portion over a tip end portion of the lower wall portion, an accommodation portion that penetrates in a plate thickness direction and accommodates the Peltier element is formed in an upper portion of the standing wall portion, and a guide hole that penetrates along the height direction of the guide member and is coupled to the inlet of the valve is formed in the lower wall portion.

6. The base station according to claim 5, wherein the lower wall portion is formed on a slant to be directed towards an upper side in the height direction of the guide member as getting closer to the tip end portion side.

7. The base station according to claim 1, wherein:
the valve is provided in a lower portion of the housing,
the low temperature portion is provided in an upper portion inside the housing, and
a guide portion is configured to guide dew condensation water produced on the low temperature portion to an inlet of the valve is provided inside the housing.

8. The base station according to claim 1, wherein the low temperature portion is placed in a region that is higher in temperature than another region inside the housing.

9. The base station according to claim 8, wherein the region of high temperature includes a region for placement of a heat generating component provided in the electronic unit.

10. The base station according to claim 1, wherein a rib that extends in a thickness direction of the housing is formed in at least one side wall portion among a plurality of side wall portions that are formed in the housing.

11. The base station according to claim 10, wherein a reinforcing portion that spreads in a height direction and a transverse width direction of the housing is formed in a bottom wall portion that is formed in the housing and is surrounded by the plurality of side wall portions.

12. The base station according to claim 11, wherein the reinforcing portion is formed in a honeycomb pattern.

13. The base station according to claim 1, wherein an outlet of the valve is directed to a lower side in a height direction of the housing.

14. The base station according to claim 4, wherein:
a plurality of auxiliary notches are formed in an arrangement direction of the pair of notches in the bottom wall portion, in a portion on a side opposite to at least one of the plurality of side wall portions relative to the pair of notches in the bottom wall portion, and
a position of a convex portion that is formed between the pair of notches in the arrangement direction of the pair of notches agrees with a position of at least one of the plurality of auxiliary notches in the arrangement direction of the pair of notches.

15. A base station comprising:
an electronic unit;
a housing including a resin and configured to accommodate the electronic unit;
a valve provided in the housing, the valve being configured to include a communication channel for communicating an inside of the housing with an outside and to open the communication channel when an internal pressure of the housing exceeds a value; and
a low temperature portion provided inside the housing and configured to become lower in temperature than a dew point inside the housing, wherein the low temperature portion includes a metal body that is placed above the valve.

16. The base station according to claim 15, wherein the metal body is in a spherical shape.

17. The base station according to claim 15, wherein the valve includes an outer cylinder being made of metal and including a part that is inserted inside the housing and another part that is exposed to outside the housing.

18. The base station according to claim 17, wherein:
the metal body is supported by the part of the outer cylinder via a support member,
the outer cylinder of the valve, the metal body, and the support member are formed with a material with thermal conductivity.

19. A base station comprising:
an electronic unit;
a housing including a resin and configured to accommodate the electronic unit;
a valve provided in the housing, the valve including a communication channel for communicating an inside of the housing with an outside and being configured to open the communication channel when an internal pressure of the housing exceeds a value; and
a low temperature portion provided inside the housing, the low temperature portion being configured to become lower in temperature than a dew point inside the housing, wherein:
the valve is configured to includes an outer cylinder made of metal, a part that is to be inserted inside the housing and another part that is to be exposed to the outside of the housing, and
the low temperature portion is configured to include the part of the outer cylinder.

20. The base station according to claim 19, wherein:
an opening portion for maintenance that is covered with a lid made of metal is formed in at least one of a plurality of side wall portions that are formed in the housing, and
a pair of notches are formed to be located on both sides across a central portion of in a transverse width direction of the opening portion in a portion on at least one of the plurality of side wall portions in a bottom wall portion that is formed in the housing and is surrounded by the plurality of side wall portions.

* * * * *